US010389168B2

(12) United States Patent
Suman

(10) Patent No.: US 10,389,168 B2
(45) Date of Patent: Aug. 20, 2019

(54) INTUITIVE SYSTEM

(71) Applicant: Shailendra Suman, Matthews, NC (US)

(72) Inventor: Shailendra Suman, Matthews, NC (US)

(*) Notice: Subject to any disclaimer, the term of this patent is extended or adjusted under 35 U.S.C. 154(b) by 598 days.

(21) Appl. No.: 14/973,662

(22) Filed: Dec. 17, 2015

(65) Prior Publication Data
US 2016/0181863 A1 Jun. 23, 2016

Related U.S. Application Data

(63) Continuation-in-part of application No. 14/639,995, filed on Mar. 5, 2015, now Pat. No. 9,706,626.

(60) Provisional application No. 62/094,062, filed on Dec. 18, 2014.

(51) Int. Cl.
H02J 1/10 (2006.01)
H02J 3/38 (2006.01)
H02J 9/00 (2006.01)
H02J 9/06 (2006.01)
G01R 31/08 (2006.01)
H05B 37/02 (2006.01)
H02J 3/00 (2006.01)

(52) U.S. Cl.
CPC .............. H02J 9/06 (2013.01); G01R 31/086 (2013.01); H02J 3/00 (2013.01); H05B 37/0263 (2013.01); H05B 37/0272 (2013.01); H02J 2003/001 (2013.01); Y10T 307/344 (2015.04)

(58) Field of Classification Search
CPC .......... H02J 9/06; H02J 3/00; H02J 2003/001; H05B 37/0272; H05B 37/0263; G01R 31/086; Y10T 307/344
USPC ......................................................... 307/23
See application file for complete search history.

(56) References Cited

U.S. PATENT DOCUMENTS 4,323,820 A 4/1982 Teich
7,481,546 B2 1/2009 Nielson et al.
8,907,523 B2 12/2014 Mohammed Suhura et al.
(Continued)

FOREIGN PATENT DOCUMENTS

GB 2208192 A 8/1989
JP 2006288049 A 10/2006

Primary Examiner — Richard Tan
(74) Attorney, Agent, or Firm — Geoffrey Gelman

(57) ABSTRACT

Various embodiments include an "Intuitive System" which detects the state of grid power at home or in commercial places and/or regions and manages the operation of various electrical and electronic systems accordingly. In various embodiments, a server may receive data from devices positioned throughout the grid. The server may aggregate, analyze, present, and/or act upon the received data. The system may enable providers to manage the health of grid power, monitor reports of power failures, analyze causes and durations of failures, engage in demand response, determine peak power demands, etc. The system may actively reduce demands for power, including, for example, by selectively reducing grid power available to constituents. However, constituents may have the capability to turn to back-up power systems, whose existence may be a determining factor in which constituents receive reduced grid power. The Intuitive System may also reduce grid load by turning down high-power devices.

11 Claims, 6 Drawing Sheets

(56) References Cited

U.S. PATENT DOCUMENTS

2003/0141819 A1 7/2003 Cojocary
2012/0065787 A1* 3/2012 Broniak .................. H02J 3/14
　　　　　　　　　　　　　　　　　　　　　　　　700/287

* cited by examiner

INTUITIVE SYSTEM

RELATED APPLICATIONS

The present application claims the benefit of priority of U.S. patent application Ser. No. 14/639,995, entitled "Intui-Network", and filed on Mar. 5, 2015; and of U.S. Provisional Patent Application No. 62/094,062, entitled "Intuitive System", and filed on Dec. 18, 2014, the entirety of each of which are hereby incorporated by reference herein for all purposes.

BACKGROUND

On various occasions, in a conventional system for distributing electrical power (e.g., an electrical grid), the grid board or electricity board does not get real information of the grid power health in some or all parts of the system. For example, if there is any grid failure at the location due to any reason such as fuse blown or transformer issue near the location, etc. The grid board may ascertain the status only when the consumer calls the grid board and informs the grid board of the actual state. If the grid board were to fix the problem remotely, the grid board still would not know if the power has been recovered successfully at the original point of failure. This leads to a gap in the overall system where the grid board has insufficient information about the system's health. In certain situations, if there are bad climatic conditions, the grid board may not know if a certain locality has grid power supplied or not.

SUMMARY

Various embodiments include a system for detecting interruptions, aberrations, dangers, and other indicators of the health of a power grid. The system may include a central "hub" that aggregates data received from various "spokes" in a power grid. The spokes may include sensors and/or other devices that can report changes in local power levels, power interruptions, etc. The hub may include a server capable of processing data, generating reports, generating predictions, etc. A representative of a utility or other service provider may access the server in order to view and respond to information about the power grid.

In various embodiments, the hub and/or devices within the spokes may engage in demand response. Accordingly, power utilization by various communities, facilities, businesses, homes, appliances, etc., may be managed in such a way as to reduce power consumption. At the same time, demand response may selectively reduce power consumption by those communities, devices, etc., most able to handle a reduction in power. For instance, certain appliances may possess sources of backup power, or may be engaged in functions that can wait until times when there is less overall demand for power from the grid.

DETAILED DESCRIPTION

Figure 1:
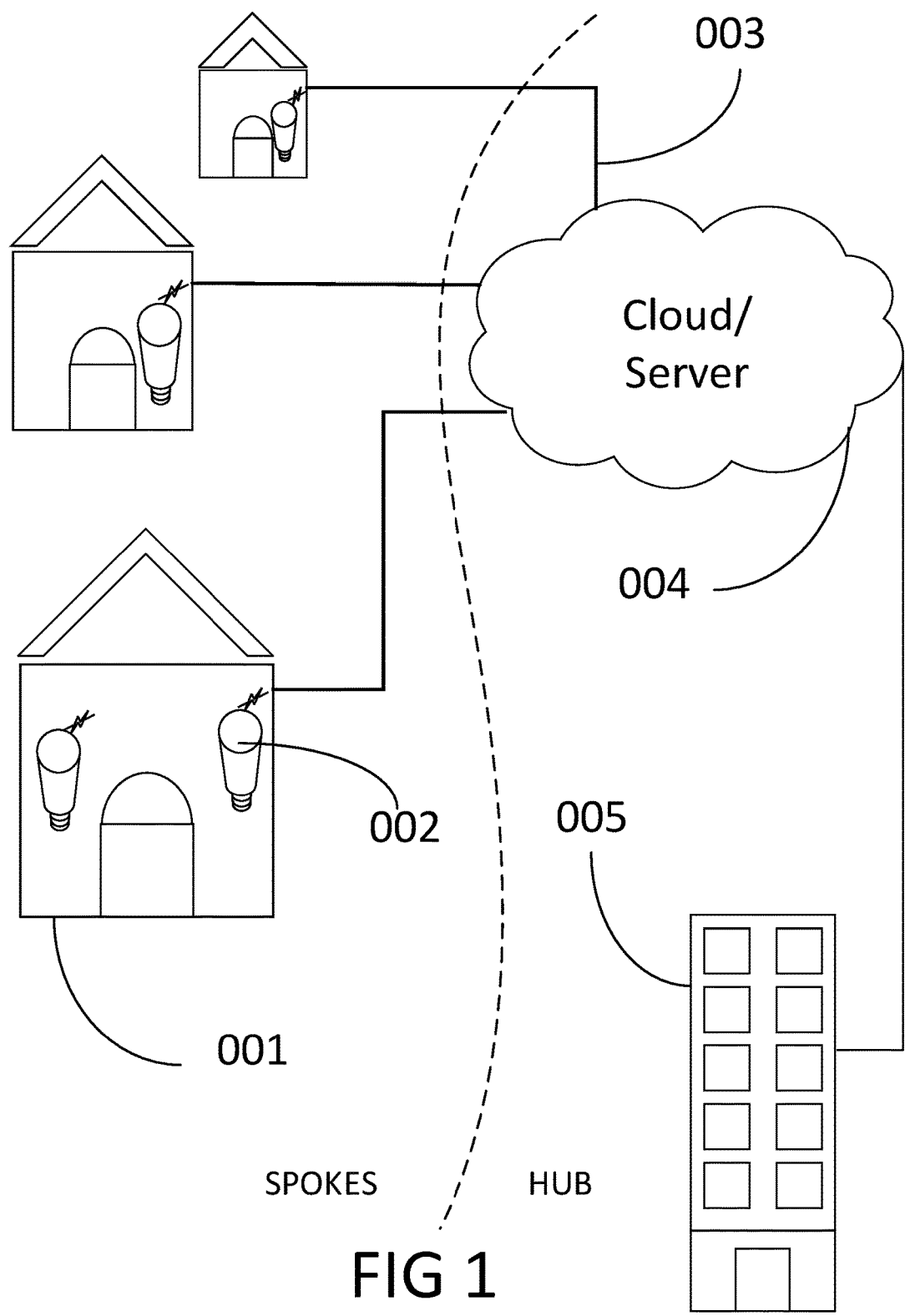
FIG. 1 provides an illustration of a system, according to some embodiments.

Various embodiments described herein may be referred to as "Intuitive Systems", or "IS". In various embodiments, the IS has many sub components distributed at various places. At a high level the system may notionally be divided in two parts called hub and spokes. However, it will be appreciated that this division into two parts is presented as a way of describing the system, according to various embodiments, and is not intended to be limiting in any way. In various embodiments, the system may be notionally divided into more than two or fewer than two parts.

In various embodiments, the spokes may include places like homes and offices, where the grid power reaches its final destination and gets consumed. The spokes may have one or more intelligent hardware and/or software devices and/or systems. An exemplary device may include a custom computer, a circuit, an appliance, a sensor, etc.

A device may provide one or more functions, including: (a) detecting power failure, (b) providing alternate power to local electrical appliances, (c) directing a "demand response", which may include a set of steps to reduce power consumption within a given area, facility, set of appliances, etc.; (d) detect peak power consumption (e.g., within a given facility, e.g., within a given set of appliances, etc.), (e) direct load balancing among one or more facilities, devices, etc., and (f) communicate data to the hub (e.g., to a central server, utility, etc.).

In various embodiments, the hub may include two key subsystems. However, it will be appreciated that various embodiments also contemplate that the hub could have more or fewer than two subsystems, and/or that the hub may be divided into subsystems in other ways that what is explicitly described herein.

In various embodiments, the one subsystem of the hub may include a hosted cloud or server. The server may perform various functions, including one or more of: (a) managing communication to and from spokes; (b) running software to manage configurations from a service provider (e.g., from a grid board service provider); (c) managing the health of spokes; and (d) providing various analytics.

In various embodiments, the second sub system may include one or more management devices, client terminals, user terminals, or the like. Management devices may be associated with a utility, grid board, service provider, etc. For example, a management device may be located at the premises of a utility. A management device may include a personal computer, workstation, tablet, mobile phone, and/or any other suitable device. Using a management device, a provider may communicate with the hosted cloud or server. The provider may receive information and analytics related to spokes, and may provide direction and instructions for managing and controlling the overall system.

In various embodiments, a representative of a service provider may access the server through a management device via a web interface. The representative may view logs showing power usage, locations of strain on the power grid, locations of disruption, etc. The representative may view analytics, geographical or topological maps of power utilization, predictions of future power outages, current response being taken to counteract strains on the grid, and/or any suitable data that may aid in managing a power grid and/or in providing any other service.

In various embodiments, the use of IS at spokes may address some of the drawbacks of a conventional system, and may enable various benefits, some of which are listed below:
1. Detection, notifications of grid power failure as well as recovery
2. Continuous monitoring of the grid health and status at spokes
3. Peak load detection at spoke and load balancing
4. Leveraging the value of "Intuitive circuits", which may include circuits that can provide back-up power in the absence of grid power, and/or provide a control mechanism for appliances and other electronic devices in the absence of grid power.
5. Engaging in demand response at spokes In various embodiments, the use of IS at hub level may provide various benefits, some of which are mentioned below:
1. Spoke level monitoring of grid power health and status
2. Community level monitoring and analytics for grid health and status
3. Closed loop system in detection of power failure and recovery
4. Management (e.g., complete management) and control of spokes demand response A system according to some embodiments may allow for locating power failure and determining various power states of a home and/or regions, and for providing an energy conservation and management system. In some embodiments, such a system may be termed an "Intuitive System".

The electrical and electronic devices which work on the grid power or AC power would not work in the absence of electricity. The electricity may fail due to various kinds of reasons such as grid power failure in a specific locality, a blown fuse, intentional power cuts, natural disasters etc. In many instances the grid power board or electricity board may not know about the power failure in a specific locality or region unless a consumer calls the electricity board and informs them about it.

Electrical and electronic home appliances or products such as light bulbs, lamps, heaters, air conditioners, fans, refrigerators, etc., may work well when there is grid power. However, when the grid power fails, the devices may not function or the devices may become such that they can't be controlled for various functionalities. In some circumstances, a consumer or electricity or grid board are unaware of the reason for failure. If a consumer calls and informs the electricity or grid board about the issue, then the electricity or grid board may start working on the resolution. Once the power is back, the Electricity Board or Grid board (EB) may not get any acknowledgement or call from the end consumer that the power is back. Due to this, the EB may not always be able to keep track of the time when the electricity is back. Furthermore, many times the reasons are also unknown for the power cuts and power recovery. The EB may face various other challenges, including knowing and analysing the following issues:
1. The location of the consumer or electric node where there is a power failure.
2. The extent of a power failure. For example, the power failure could encompass one house, a couple of houses, or larger localities where there are power outages.
3. The duration of a power outage
4. The ongoing status of the grid power health
5. The exact location of the electric node in the presence of grid power, and the exact location of an electric node in the absence of the grid power.
6. Status of the consumer if they have opted for "demand response" and a good or optimal means to take appropriate action, including taking such action seamlessly
7. Load balancing the grid power during high or peak power demand
8. Providing Wi-Fi availability, such as providing repeaters and router, in the presence and absence of the grid power.

In various embodiments, the Intuitive system (IS) may address one or more of these challenges. In various embodiments, the IS has an embedded system with its own battery, microcontroller, global location engine, GSM/CDMA (Global System for Mobile/Code division multiple access) system, intuitive software (e.g., software that can detect an on/off switch state in a circuit with no power and/or cause a device to switch to back-up power in the absence of power) and back-end server or cloud system.

As used herein, a "demand response" or similar service or system may include a service or system that responds to use or demand of power. The use of power may include use of power by an individual, by a community, by a location on a grid, by a portion of a grid, etc. A response may include reducing the use of power, such as by shutting off one or more appliances, reducing the power consumption of an appliance (e.g., reducing level of a thermostat to use less power, e.g., dimming a light to use less power), or otherwise altering power consumption and/or power distribution. A demand response system may be controlled by an electric board, utility, or by any other party. A demand response system may seek to balance or optimize the load on a power grid or portion of a power grid. For example, when there is high demand for power, a demand response system may reduce the use of power consumption to some degree (e.g., by shutting off one or more appliances).

Various embodiments include an IS with various components, which may also be referred to as sub-system components. Such sub-system components may include, without limitation, an illumination source (e.g., an LED bulb) with energy source (e.g., battery back-up), an intuitive circuit (as defined below), a communications device (e.g., a SIM card with GSM/CDMA service), a location sensor (e.g., a GPS location module), a server software component, software service for various solutions, etc.

In various embodiments, an IS electronic circuit can be interfaced with electrical or electronic gadgets, such as with air conditioners, heaters, fans, refrigerators, dish washers, washing machine, personal computers, etc.

In various embodiments, an IS electronic circuit can be interfaced to many electrical or electronic gadgets together or individually.

In various embodiments, an IS electronic circuit can be interfaced with an individual house, with a couple of houses, and/or with a community together or individually.

In various embodiments, an Intuitive circuit includes a circuit that can detect whether a switch is on or off even in the absence of grid power. The intuitive circuit may, for example, use an internal power source to broadcast a signal through an electrical network (e.g., through a home electrical network). If the signal is detected back at the intuitive circuit again, then it may be inferred that the signal has traversed a closed circuit, including a closed switch. Accordingly it may be inferred that the switch is on, in some embodiments. If no return signal is detected at the intuitive circuit, then it may be inferred that the switch is off.

Accordingly, in various embodiments, an Intuitive circuit may allow a switch to control a device (e.g., a light) even in the absence of electrical power from the power grid.

In various embodiments, an IS electronic circuit includes an Intuitive circuit and algorithm which detects the real state of the grid power i.e. it detects either the On/Off switch has been closed/open or there is a real grid failure.

In various embodiments, an IS electronic circuit has SIM/data (subscriber identity module/data) or other data card with a GSM/CDMA module (or with a module for using some other mode of wireless communication) with cellular network service.

In various embodiments, an IS electronic circuit has GPS or other location sensor or other location engine. In various embodiments, a location engine may be either enabled by the GPS module and/or by cellular service providers' service for location identification, such service possibly including triangulation, GSM tower based identification, etc.

In various embodiments, an IS can send a notification to an EB via cellular service (SMS/data/audio etc.). The notification may indicate the status of grid power.

In various embodiments an IS can send a notification about one or more domestic situations, such as fire alarm, natural disaster, power consumption, demand response status, gas leakage alarms, accidental precautionary alarms etc.

In various embodiments, an IS has cloud or server based system which receives the various notifications from the individual IS circuits, where such notifications may, for example, indicate the status of grid power.

In various embodiments, the IS decodes the notification(s) and executes the location based algorithms to identify power failure as well as recovery. This decoding may also give information on the geographical location of the notifying IS circuit or device.

In various embodiments, the EB can determine and/or analyse the location where there is grid failure, or understand the distribution of grid power consumption (e.g., understand the location(s) where grid consumption highest) and utilise this data for various purpose such as failure/ recovery analysis, load balancing, demand response, proactive measures to prevent accidents by turning off grid with the help of various cellular notifications etc.

DESCRIPTION OF THE DRAWINGS

FIG. 1 depicts solution system according to various embodiments. The system is depicted with the hub and spokes as separate subsystems. The spokes 001 may include houses, communities, community places, restaurants, offices, shopping centres, business complexes, and/or factories, either individually, in combination, and/or all together. The spoke may include IS components 002. An IS component 002 is configured with connection to hub or hubs and broadcasts local intelligence to hub. The component 002 is also configured with a demand response protocol. The component 002 can come in many forms, configurations, etc. The component 002 may include, various circuits, devices, appliances, etc., such as LED, bulb, electronic gadget, active device with demand response configuration, high power switching relays to operate the heavy duty electrical appliances, GPS/GPRS (Global Positioning System/General packet radio service) system, Wi-Fi access points, Wi-Fi routers etc. The component 002 may store and/or execute one or more software programs, modules, algorithms, etc., in order to carry out steps in accordance with one or more embodiments.

At 003 is depicted a communication channel to the hub subsystem, according to various embodiments. In various embodiments, the communication channel may be secured. Communication channel 003 could take the form of wired or wireless internet communication or via GPRS communication for telecommunication service provider. At 004 is depicted a server, according to some embodiments. The server may take the form of a cloud subsystem or hosted cloud or on premise server, according to various embodiments. The server may execute various algorithms to carry out one or more embodiments as described herein. At 005 is depicted an administrator access point, according to some embodiments. The administrator access point may include a terminal, a computer, an Internet connection and/or any other means for connecting with server 400. The access point may be located or hosted at the grid board or service provider (e.g., at a utility's offices). The access point 500 may allow a user to exercise control over the function of the server 004. According to various embodiments, the access point may be web based. The access point 005 may make secured connection with server 004 and control the functionality of server 004.

Figure 2:
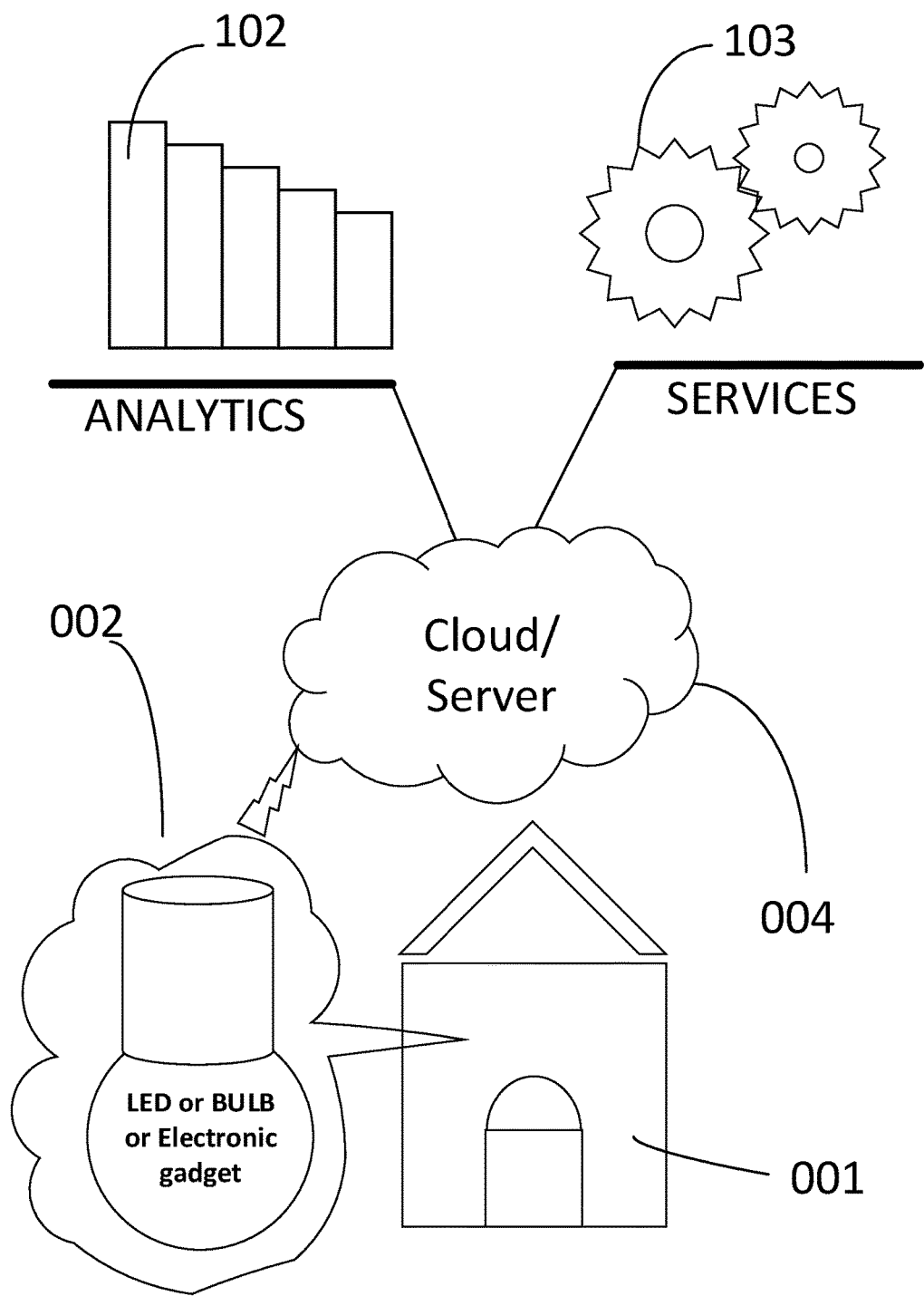
FIG. 2 provides an illustration of a block diagram of system, according to some embodiments.

FIG. 2 depicts a block diagram of an IS according to some embodiments. In various embodiments FIG. 2 represents the high level system with various blocks depicting various subsystems of the IS.

There may be a LED or bulb or electronic gadget, as depicted in 002, which may include battery, GPS module, GSM module and intuitive circuit, according to various embodiments. As per various embodiments the subsystem components of 002 may detect the real grid power failure or the state of on/off switch. As per various embodiments the subsystem components of device 002 may detect the real power failure inside the house, or office or the location where it is installed. The device 002 may have GPS and GSM units embedded in the system which may help to understand the existing location where it is installed. As per various embodiments, device 002 and/or the subsystem components of device 002 would then send the state of power failure to the cloud or server. The server may be still on-line due to the presence of power at its location. The server may run various software, including an application and notification system for taking appropriate actions, such actions including one or more of: (a) assigning staff to address the power failure, (b) providing analytics for analysing the various trends for one or more localities; (c) understanding if the power failure happened only at an individual house or for an entire locality (and/or otherwise localizing the point of a power failure); (d) maintaining a database for "demand response" subscription and take appropriate actions accordingly; (e) understanding when the power is coming back; (f) performing various root cause analysis, etc.

In various embodiments, a database may contain a "demand response" subscription. This may include records of one or more entities, including devices, appliances, houses, communities, facilities, businesses, etc., where such entities are consumers of power. The database may store various information about such entities, including average power consumed, importance of its function (e.g., whether the device is a life-support system or a simple cleaning appliance), priority, availability of back-up power, preferred time of usage, expected time of usage, and/or any other information about the entity. Such information may be used in creating demand response, whereby one or more entities are caused to reduce their power consumption in response to excess power demand. For example, entities which use a lot of power or have lower priority may be caused to reduce power consumption as part of demand response.

As per various embodiments the subsystem components of device 002 can be installed directly to the grid power coming at the house without any on/off switch or any other circuit which disrupts its power. In such situation, the device 002 may clearly detect the state of the grid power status. As per various embodiments the subsystem components of device 002 include a software API to communicate with cellular service provider. This API or software would request the location of the device 002 to the cellular service provider either by triangulation, by tower location, or by any other method. As per various embodiments the subsystem components of device 002 can register its address to the cloud or server at the time of installation. The grid board or electricity board would identify the location of device 002 by any or all the techniques mentioned above. As per various embodiments the subsystem components of device 002 would at times (e.g., occasionally, periodically, and/or always) state the heartbeat (e.g., the current rate of usage, e.g., the current level of usage) for grid power, location, power consumption of the home, real-time status of the grid power availability, managing the services of "demand response" etc.

As per various embodiments the subsystem component 004 depicts the cloud or server system which takes the online and offline data from device 002. The server would be typically managed by the grid board for various applications such as grid failure notification, overall analytics for monitoring the trends, command and control for device 002, detect the state of various devices similar to device 002 in and around the locality where there is a grid failure, status of power recovery, root cause analysis for the power failure, power load analysis, managing the "demand response" based on the subscription etc.

As per various embodiments the subsystem component, module 102, depicts the analytics, algorithms, and data intelligence derived from the data received from device 002, grid board and various parameters set for various applications.

As per various embodiments the subsystem component, module 103, depicts the services to be built in and around the analysis, data, subscription, etc., by the grid power board. Exemplary services, according to various embodiments, may include managing the "demand response", load balancing, power shading, taking anticipatory actions based on the trends, results of overall analytics etc.

As per various embodiments the subsystem component 001 depicts an individual home or community or industry which is installed with the system 002.

Figure 3:
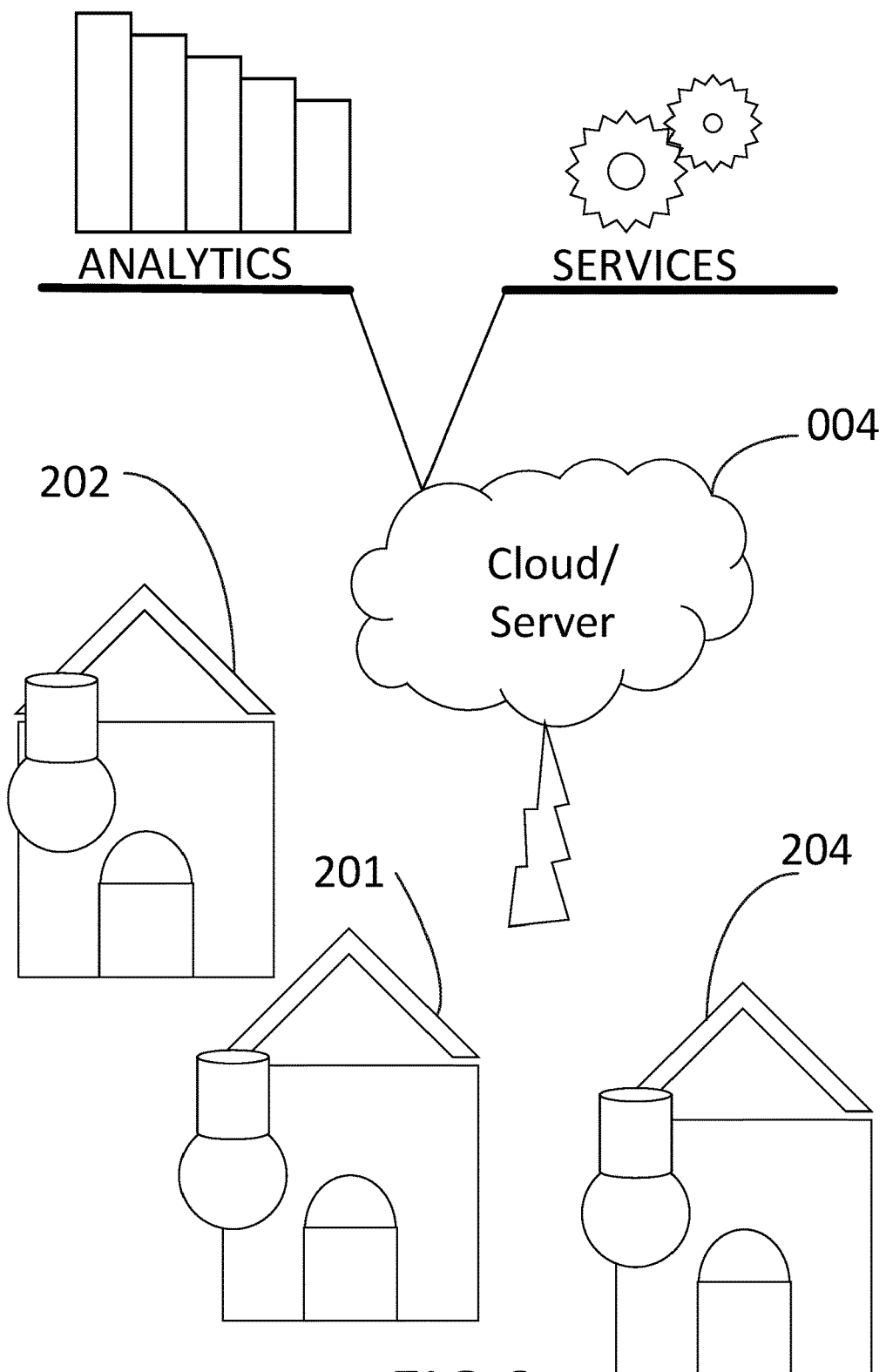
FIG. 3 provides an illustration of a block diagram of system, according to some embodiments.

Reference is now made to FIG. 3. As per various embodiments, the subsystem component 201, 202, 204 depicts more than one IS such as 002. The components such as 201, 202, and 204 altogether could be a part of a community or part of different communities, different districts, different states etc.

As per various embodiments the subsystem components 201, 202, 204 relate to a community. If there is a power failure only in 201 and not in 202 and/or 204 then it may be inferred that there is no defect or issue with the grid power board. The problem could be related to the individual home or 201. In such situations, the subsystem components 004 (e.g., cloud or server 004) could perform an analysis, localize the problem and take appropriate anticipator actions, services etc.

Figure 4:
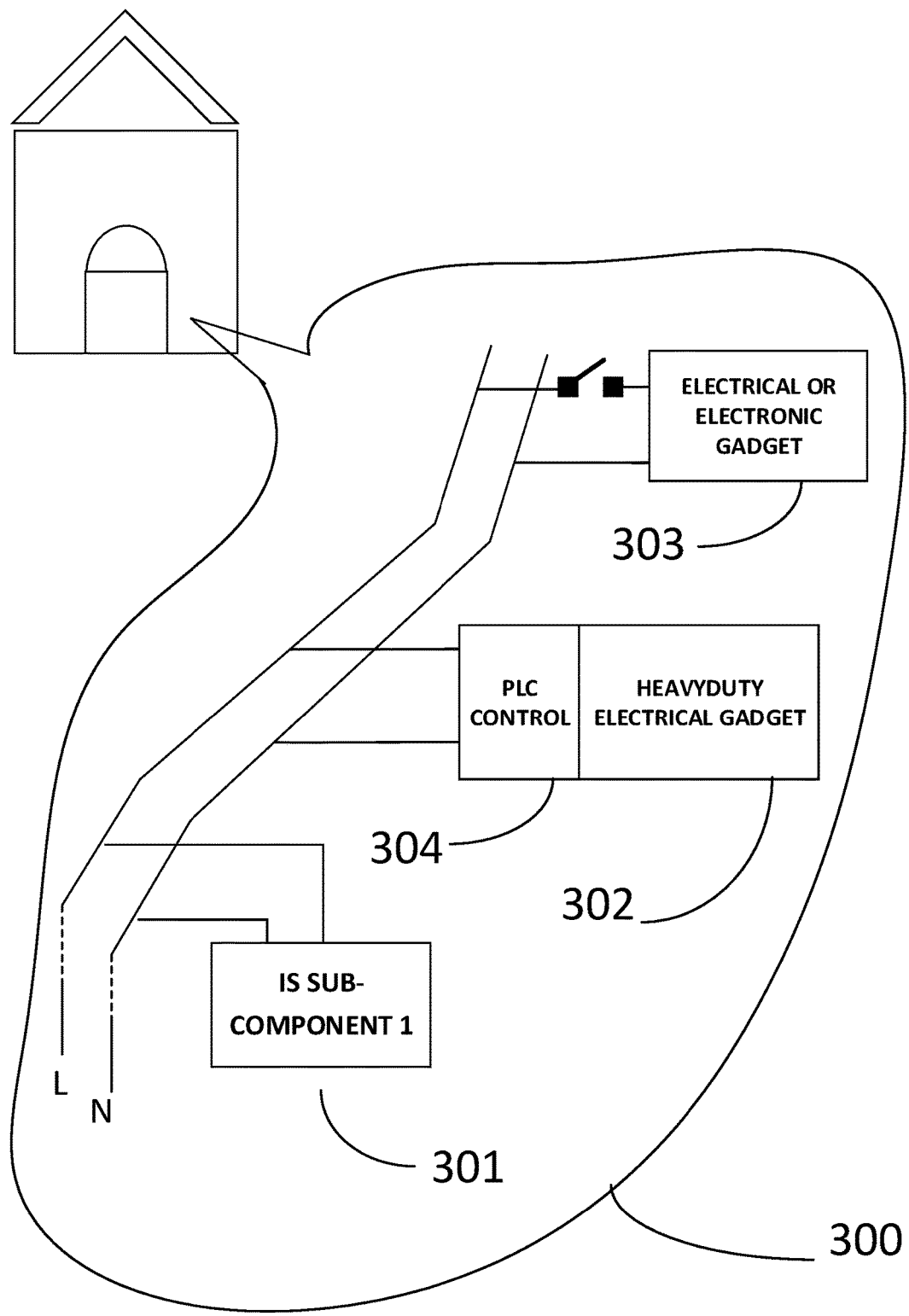
FIG. 4 provides an illustration of an electrical network at a home, according to some embodiments.

Reference is now made to FIG. 4. As per various embodiments, the subsystem component 300 depicts a typical electrical network at home where there may be connected one or more electrical and electronic gadgets to the power line and neutral. As per various embodiments, the subsystem component 301 may include components similar to those of device 002. In various embodiments, component 301 may include a battery (or other source of power), intuitive electronics, GPS, GSM/CDMA interface. As per various embodiments the subsystem component 302 depicts electrical or electronic gadgets with PLC circuit to be used for Power Line Communication. As used herein, "power line communication" or the like may refer to a means of communication that allows electrical wiring to carry data as well as electrical power. In the case where home network 300 is registered and subscribed for "demand response" services then grid board (e.g., via the server) may send respective command to 301 to switch off the heavy duty devices such as device/system 302. In various embodiments, the device/system 301 may decode the information from the grid power board and send the respective communication to the device/system 304 over power line communication. (As will be appreciated, other modes of communication may also be used, in various embodiments.) This in turn switches off or on the power to 302. The device/system 302 may be turned on or off or controlled for its operation based on the subscription or services opted by the user for the device/system 304's operation. In various embodiments, the grid power board may analyse the domestic power consumption may be very high during peak power and decide to reduce the power load by turning of the heavy duty equipment's such as device/system 302 and 304 through remote services of the cloud. As per various embodiments the device/system 304 may send the status of its power consumption to device/system 301. The device/system 301 may, in turn, send the overall power consumption patterns, periodicity of power usage, etc., to electricity board such that the device/system 302's operational power requirement can be optimally managed using smart services from grid power board. As per various embodiments, the subsystem component 303 depicts a typical electrical or electronic gadget controlled by on/off switch for it operation. The component 303 is depicting a standard device working in the environment where the IS (including 301 and 302) has been incorporated into the existing system.

Figure 5:
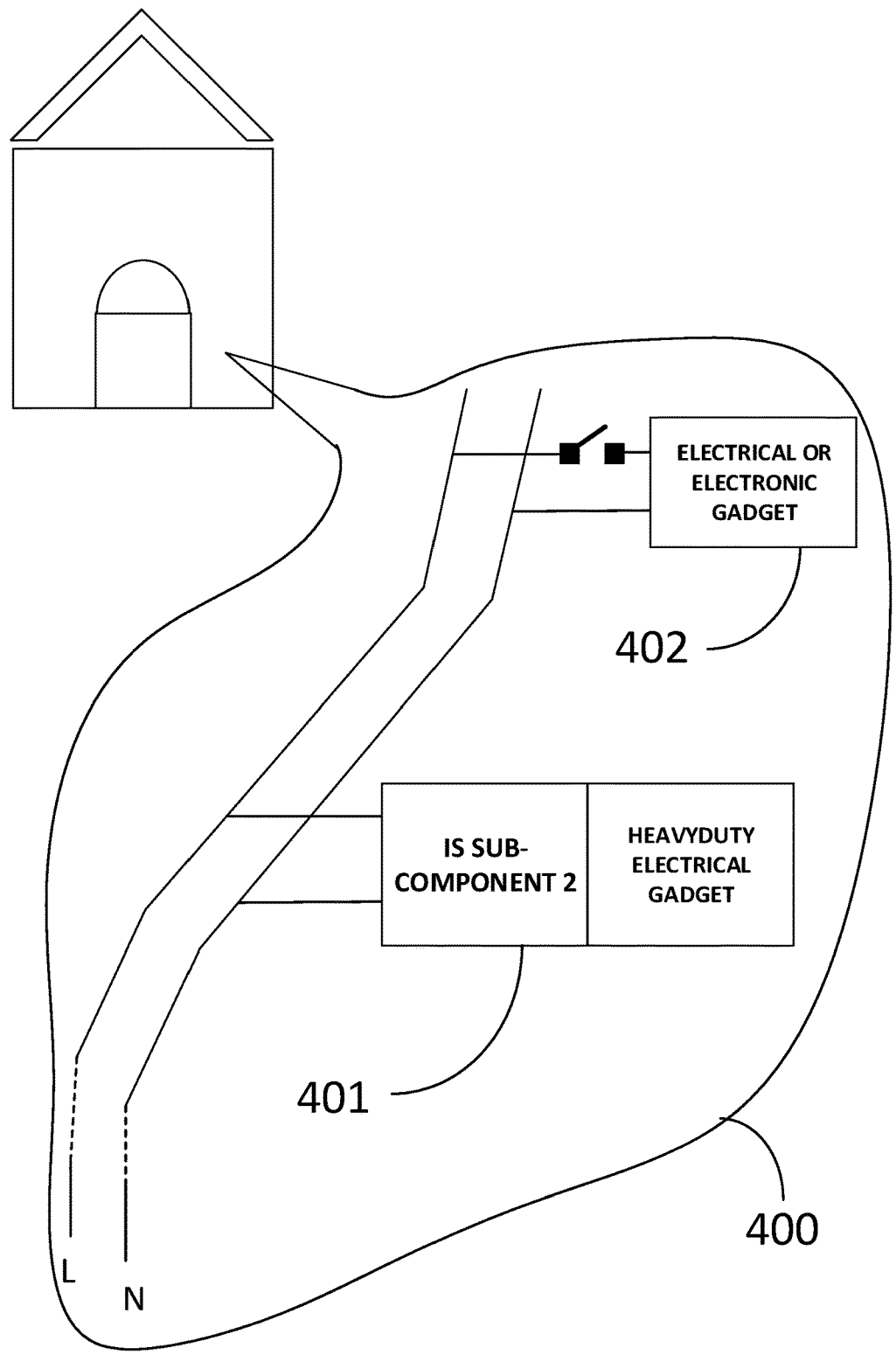
FIG. 5 provides an illustration of an electrical network at a home, according to some embodiments.

Reference is now made to FIG. 5. As per various embodiments, the subsystem component 400 depicts similar functionality to that of 300. As per various embodiments the device/systems 301 and 304 may operate as separate electronic circuits. As per various embodiments the device system 401 may combine or integrate the functions of both device/systems 301 and 304 for various functionalities. At 402 is depicted a standard device working in the environment where the IS (400 and 401) has been incorporated into the existing system.

Figure 6:
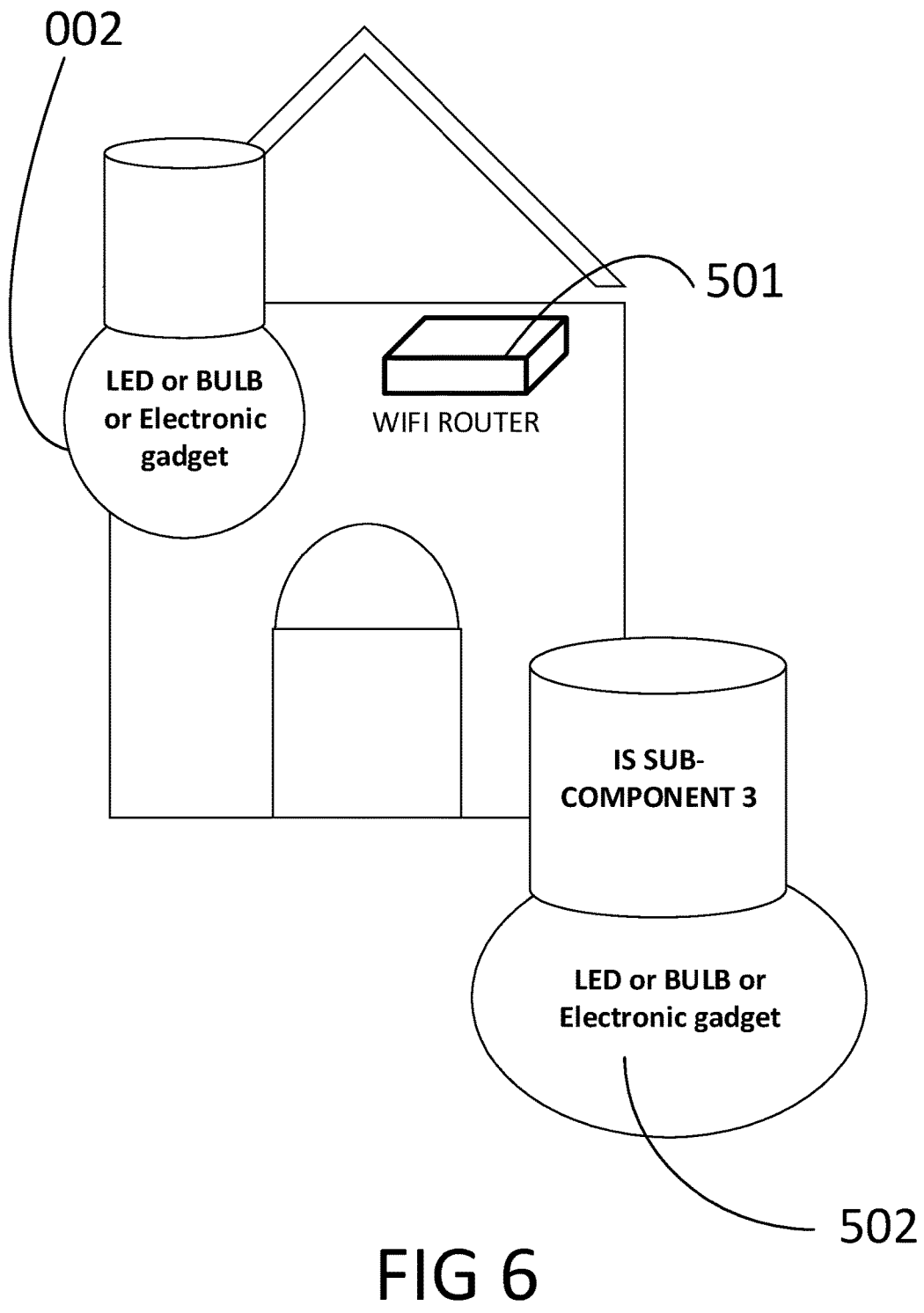
FIG. 6 provides an illustration of a home with a communications hub, according to some embodiments.

Reference is now made to FIG. 6. As per various embodiments the subsystem component 502 depicts a wireless internet router or repeater. As per various embodiments the subsystem component 002 depicts wireless internet connectivity to local home or building covering certain area around it vicinity. As per various embodiments the subsystem component 501 depicts internet router with or without battery and wireless connectivity. The component 502 has internet connectivity to either 002 and or 501 such that it provides the wireless internet connectivity in the areas at home where 002 or 501 does not have wireless signal reach. The component 502 acts as a wireless repeater for the paired device such as 002 and or 501. The component 502 provides the Wi-Fi internet connectivity to the end user in the presence or absence of the grid power. In various embodiments, the component 502 would have the intuitive electronic circuit to detect the presence or absence of the grid power and provide the internet connectivity as per users control irrespective the availability of grid power.

Embodiments

In various embodiments, a spoke has grid failure detection circuit. In various embodiments, a spoke may have more than one gird failure detection circuit. Once such a circuit detects the grid failure it sends this status to hub. The hub in turn investigates and/or directs the investigation of the cause of failure. The failure may turn out to be a failure at the home/domestic level, at the community level, or at any other level. If there is community level failure, then the grid board may receive signals from many detection circuits and/or spokes from the community. This may help the grid board to analyse the root cause and take corrective steps. After the corrective steps have been taken, the grid power may be recovered at spokes. The spokes may send the latest status back to hub, and may accordingly provide the hub with an indication that power has been recovered. In this way, the grid board gets confirmation that the system is up and running.

In various embodiments, a spoke system includes battery back-up. For example, one or more devices, circuits, locales, dwellings, businesses, communities, etc., may have battery backup. In various embodiments, a local communication network may be created at one or more spokes. In this way, two or more circuits (e.g., circuits mounted on various gadgets) at a given spoke may communicate with each other. These circuits may detect a power outage. These circuits may also send indications of the health of grid power to the hub. Health indicators may include indicators of any peak load situations (e.g., power usage is at peak capacity), power interruptions, grid heartbeat, notifications that a given spoke is responding to demand response, etc.

In various embodiments, one or more circuits in a spoke detects peak loading of the grid power by domestic devices. The peak loading can be detected either by measuring dip in voltage on mains or peak loading current drawn by the spoke. In an illustrative example, a user is running the washing machine when the given spoke is already drawing the maximum average power allocated to it. In this situation, the user will be paying a higher electricity bill if the situation happens during a demand response episode. To avoid higher billing, the spoke circuit detects the peak power and sends a command to other intelligent spoke devices to turn off. For example, other intelligent devices may include devices mounted before (or otherwise associated with) a refrigerator, heater etc. An appliance itself might constitute an intelligent device, in various embodiments. So an intelligent device may turn itself for the duration when power hungry devices (e.g., washing machines, etc.) are drawing high or peak power. The above scenario could also occur even during non-demand response episodes. For example, the user is allocated an average as well as maximum power to be consumed per month. In a situation where the user is consuming peak power as described above, then it is useful to turn off a few electrical appliance to balance out the peak or average power allocated to the user.

As explained earlier Intuitive circuit has back up battery. In various embodiments, in the event of power failure intuitive circuit mounted on the electrical or electronic gadgets uses battery power and keep itself operational without any interruptions. This helps in uninterrupted operation of the devices.

In various embodiments, the grid board and/or service provider would have one or more spokes registered with them for demand response. In such case the hub broadcasts the demand response notifications, which are received by the registered spokes. In turn, spokes may take responsive actions. Such actions may include directing certain appliances or devices to reduce power consumption, directing certain appliances or devices to switch to battery power or other backup power, etc.

In the event of a demand response episode an intuitive circuit may receive information on the start of a demand response episode (e.g., may receive a notice that power consumption should be reduced in light of high demand) and cuts off the power from the grid or mains and operates on battery power (or on other backup power).

In various embodiments, a user may receive points, credits, rewards, payments, or, any other incentive in return for responding to demand response episodes. For example, a user may receive discounts on his utility bill for reducing power consumption at times of peak power demand by others in the community. A user may thereby be incentivized to improve the overall health of the electrical grid, including during times of high vulnerability (e.g., to outages, interruptions, etc.).

In various embodiments, in the event of demand response episode, a spoke device that includes an Intuitive circuit may shut down a high power device to reduce the electricity bills. For example, electricity bills may increase during times of high demand, and reducing power consumption at such times may lead to significant savings.

In various embodiments, the hub is deployed either on the hosted cloud or server or on premise server as per the business needs of grid board or service provider or private companies as per the contractual terms between them.

In various embodiments, there may be secured communication between the spokes and hub. The spoke devices may have battery back-up so they communicate with hub even though there are interruptions in power from grid.

In various embodiments, a spoke device may have separate data connectivity with a mobile or telephone service provider, where such connectivity may be independent (or not wholly dependent) of the presence of grid power. In various embodiments two or more spoke devices may form a local network (e.g., an internet hub) which is connected to Wi-Fi hub at spoke. This Wi-Fi hub may also run on battery back-up as per the configuration of spoke. In various embodiments, forming a local internet hub helps by using one single internet facing connection to a server, cloud, etc.

In various embodiments, the hub receives the status of grid health from one or more (e.g., from all) spokes periodically. The data communication is spread such way that there is no load on cloud or server from many simultaneous communications. For example, in some embodiments, data about grid health may be communicated to the hub at random intervals, or at random times during a designated window, so as to reduce the likelihood of high concurrent data transmission.

In various embodiments, the server may run analytics (e.g., may run analytical algorithms), and may analyse such things as: (a) grid failure (e.g., times, locations, etc. of grid failure); (b) recovery of power at spokes and/or communities (e.g., places and times where grid power has been recovered); (c) demand response broadcasting (e.g., which parties have been informed about a demand response episode, which parties have responded, which parties have endeavoured to reduce power consumption, etc.); (d) collecting credit points, (e.g., which parties have earned credit points) etc.

In various embodiments, the hub runs notifications and reporting to spokes and grid board or service provider. These notifications may include notifications about grid power failures sent to grid board or service provider, demand response start and end notices sent to users and spokes, billing related reporting to users, grid board, service provider etc.

In various embodiments, user or client device, a client terminal, etc., may be associated with a grid board, service provider as well as user. The client terminal may allow a grid board representative or other party to peruse information received at the server. A client application can be enabled via secured web browser connection with hosted cloud or server. Or there can be smart phone apps which make secured connection with hosted cloud or server for accessing status, notifications, reports etc.

In various embodiments, the system can predict the amount of electricity savings during demand response based on various parameters like typical peak load during day, individual loading pattern at home etc. The system may, for example, award credit points based on savings achieved.

In various embodiments, in order to instruct or motivate users and/or other spoke constituents to reduce power during demand response episodes, the Grid board can broadcast special communications to individual home or common messages to multiple homes. In various embodiments, messages and/or computer instructions may be sent to individual devices to instruct them to reduce power consumption by an associated appliance, facility, home, business, etc.

In various embodiments, the failure of any IS devices can be communicated so that the grid board knows to replace them.

In various embodiments, a rationing device may be operable to limit, or cap the amount of power that goes to a spoke, community, house, business, dwelling, etc. The rationing device may ration power based on the availability of power overall, the capacity of a particular spoke (or community, etc.) to handle the power, the strain at a particular spoke (or community, etc.), or based on any other reason.

The Following are Embodiments, not Claims

D. A device connected to an electrical grid, the device comprising:
    a functional portion for effecting a local environment;
    a sensor for detecting power levels in the electrical grid;
    a memory; and
    a processor, in which the processor executes computer code stored in the memory to:
        cause the functional portion to operate at a first level of power drawn from the electrical grid;
        receive from the sensor an indication of a second level of power that is available in the electrical grid;
        determine, based on the indication of the second level of power, that the grid is not operating in a healthy manner;
        and, in response to the determination, cause the functional portion to operate at a third level of power drawn from the grid, in which the third level of power is less than the first level of power;

The device may server the functions of an appliance, for example.

D.1 The device of embodiment D in which the functional portion is one of: (a) a heating unit; (b) a cooling unit; (c) washing machine; (d) a dryer; (e) a water boiler; (f) a lighting unit; and (g) a fan.

D.5 The device of embodiment D, in which, in determining that the grid is not operating in a healthy manner, the processor determines that the second level of power is less than an average historical level of power available in the electrical grid.

D.3 The device of embodiment D in which the third level of power is positive.

D.4 The device of embodiment D in which the third level of power is zero.

D.2 The device of embodiment D further comprising a battery, in which the processor further executes instructions to:
    cause the functional portion to draw power from the battery.

In various embodiments, an appliance, device, etc., may be switched to battery power even if there is still available grid power. The switch may be performed as a precaution to improve grid health, reduce the chances for a power outage, etc.

D.2.1 The device of embodiment D.2, in which the second level of power that is available in the grid is positive.

In various embodiments, an appliance can detect the state of a switch even in the absence of grid power.

D.2.2 The device of embodiment D.2 further including a detector circuit, the detector circuit comprising:
    a signal generator for transmitting an electrical signal into the electrical grid;
    a receiver for receiving the same electrical signal back from the electrical grid in the event the signal has traversed a closed loop within the grid;
    a logic element for inferring an on or off state of a switch within the electrical grid based on a positive or negative detection of the electrical signal at the receiver; and
    a communications port for transmitting an indication of the on or off state of the switch to the processor.

D.2.2.1 The device of embodiment D.2.2 in which the processor further executes instructions to:
    receive from the detector circuit an indication that the switch is off; and
    direct, in response to the indication that the switch is off, the functional portion to cease operation.

A system according to various embodiments may be capable of determining the source of a failure or other problem in an electrical grid.

A. A system for analysing strain in a power grid comprising:
    a server comprising:
        a server communications port;
        a server memory; and
        a server processor, and
    a first device and a second device, the first device electrically coupled to the power grid at a first location, the second device electrically coupled to the power grid at a second location, and each device separately comprising:
        a sensor for detecting electrical power at its respective location on the power grid;
        a device communications port;
        a device memory; and
        a device processor, in which the device processor executes computer instructions stored in the device memory to:
            receive from the sensor an indication of a level of electrical power; and
            direct the device communications port to transmit to the server an indication of the level of electrical power,
    in which the server processor executes computer instructions stored in the server memory to:

receive from the first device a first indication of a first level of electrical power at the first location;
receive from the second device a second indication of a second level of electrical power at the second location;
determine, based on the first indication, the second indication, the first location, and the second location, a third location on the power grid that has encountered a disruption; and
direct the server communications port to transmit an indication of a remedial action to a responsible party.

A.x The system of embodiment A in which each device further comprises a source of back-up power.

A.x.1 The system of embodiment A.1 in which the source of back-up power is a battery.

In various embodiments, the server takes corrective action by telling a maintenance person where the location of the disruption is.

A.3 The system of embodiment A in which, in directing the communications port to transmit an indication of a remedial action, the server processor executes computer instructions to:
determine a responsible party that is proximate to the third location; and
direct the server communications port to transmit to a device of the responsible party a message that conveys the third location.

In various embodiments, if two devices have indicated there is no power, then the point of disruption is determined as a point that is "upstream" of both the first and second device locations.

A.1 The system of embodiment A in which both the first indication and the second indication are of an absence of electrical power, and in which the third location is determined as a location on the grid through which power flows to both the first and second locations.

In various embodiments, if only one device has indicated there is no power, then the point of disruption is determined as a point that is "upstream" of only the device which detects no power.

A.2 The system of embodiment A in which the first indication indicates a presence of electrical power, the second indication indicates an absence of electrical power, and in which the third location is determined as a location on the grid through which power flows to the second location but not to the first location.

In various embodiments, demand response may include selectively shutting off appliances, or, at a larger scale, selectively shutting off a home, etc.

B. A system comprising:
an electrical network comprising one or more power lines;
a set of two or more active appliances, each appliance connected to the electrical network and drawing electrical power from the network;
a device connected to the electrical network, the device comprising:
a sensor for detecting a level of power in the electrical network;
a communications port;
a memory;
a processor, in which the processor executes computer instructions stored in the memory to:
receive from the sensor an indication of a first level of power in the electrical network;
determine that the first level of power exceeds a first permissible level of power;
determine a first appliance from the set of active appliances; and
direct the communications port to transmit to the first appliance instructions to reduce its consumption of power from the electrical network.

Various embodiments include methods of determining what the permissible levels of power are. For example, if now is a peak load time, then permissible levels may be lower (e.g., for any given household, entity, community, etc.).

B.11 The system of embodiment B in which, in determining that the first level of power exceeds a first permissible level, the processor executes computer instructions to:
determine a time of day;
determine the first permissible level based on the time of day; and
determine that the first level of power exceeds the first permissible level.

In various embodiments, the user has an average power allotment for the month (equivalent to a total amount of energy he can use in the month). So the permissible power level he can use in the current moment is based on the allotment, the amount of energy he has already used, and the amount of time remaining in the month.

B.12 The system of embodiment B in which, in determining that the first level of power exceeds a first permissible level, the processor executes computer instructions to:
determine an energy allotment for a given period of time;
determine past energy usage for the given period of time;
determine a remaining amount of energy that can be used for the given period of time;
determine an amount of time remaining in the given period of time;
determine the first permissible level based on the remaining amount of energy and the remaining period of time; and
determine that the first level of power exceeds the first permissible level.

In various embodiments, the device sends a health message to the server. The message may be, for example, about the first power level.

B.8 The system of embodiment B further comprising a server, in which the processor further executes instructions to:
cause the communications port to transmit to the server the indication of the first power level.

B.9 The system of embodiment B further comprising a server, in which the processor further executes instructions to:
receive from the sensor an indication of an interruption in power in the electrical network; and
cause the communications port to transmit to the server the indication of the interruption.

B.10 The system of embodiment B further comprising a server, in which the processor further executes instructions to:
receive an indication that the first appliance has reduced its consumption of power; and
cause the communications port to transmit to the server the indication that the first appliance has reduced its consumption of power.

B.7. The system of embodiment B in which the device further comprises a back-up source of power.

B.7.1. The system of embodiment B.7 in which the back-up source of power is a battery.

In various embodiments, when power levels are no longer under strain, the appliance can be told to come back on again.

B.6 The system of embodiment B in which the processor further executes instructions to
- receive from the sensor an indication of a second level of power in the electrical network;
- determine that the second level of power is beneath a second permissible level of power; and
- direct the communications port to transmit to the first appliance instructions to restore its consumption of power from the electrical network.

In various embodiments, a device tells an appliance to actually shut off (as opposed to just reducing its power utilization).

B.0 The system of embodiment B in which, in directing the communications port, the processor directs the communication port to transmit to the first appliance instructions to shut off.

In various embodiments, a device communicates with an appliance via power-line communication.

B.1 The system of embodiment B in which the communications port is coupled to the electrical network and in which the communications port transmits the instructions to the first appliance via power line communication.

B.2 The system of embodiment B in which, in determining the first appliance, the processor determines the first appliance as the appliance that is using the most power from among the set of active appliances.

B.3 The system of embodiment B in which, in determining the first appliance, the processor determines the first appliance as the appliance that has the lowest priority from among the set of active appliances.

B.4 The system of embodiment B in which, in determining the first appliance, the processor determines the first appliance as the appliance that has a capability of continuing to operate from battery power.

B.4' The system of embodiment B in which, in determining the first appliance, the processor determines the first appliance as the appliance that has a capability of operating the longest from battery power of any of the set of active appliances.

B.4" The system of embodiment B in which, in determining the first appliance, the processor determines the first appliance as the appliance that has the most battery power remaining of any of the set of active appliances.

B.5 The system of embodiment B in which, in determining the first appliance, the processor executes instructions to:
- direct the communications port to transmit to each of the active appliances a request for volunteering to reduce power consumption;
- receive, via the communications port, indications from one or more of the active appliances of willingness to reduce power consumption; and
- determine the first appliance from among the one or more of the active appliances that have indicated willingness to reduce power consumption.

In various embodiments, demand response may be performed at a high level, such as at the the grid level.

C. A system comprising:
- an electrical network comprising a first power line and a second power line, each power line branching from a common hub and delivering power, respectively to a first community and to a second community;
- a first set of sensors associated with the first power line;
- a second set of sensors associated with the second power line;
- a rationing device located at the hub, in which the rationing device is operable to independently adjust the amount of power that goes to each power line;
- a server in communication with the set of sensors and with the rationing device, the server comprising:
  - a server communications port;
  - a server memory;
  - a server processor, in which the server processor executes computer instructions stored in the server memory to:
    - determine an aggregate level of power used by communities served by the hub;
    - determine that the aggregate level of power exceeds a predetermined threshold;
    - receive from the first set of sensors an indication of a first level of power drawn by the first power line;
    - receive from the second set of sensors an indication of a second level of power drawn by the second power line;
    - determine that the first community must reduce its power consumption; and
    - cause the server communications port to transmit instructions to the rationing device to reduce the level of power that goes to the first power line.

C.4 The system of embodiment C in which, in determining that the first community must reduce its power consumption, the server processor executes instructions to:
- determine that the first community includes a non-essential facility.

C.5 The system of embodiment C in which, in determining that the first community must reduce its power consumption, the server processor executes instructions to:
- determine that the first community includes a facility that is a heavy user of power.

C.6 The system of embodiment C in which, in determining that the first community must reduce its power consumption, the server processor executes instructions to:
- determine that the first community pays a lower price for power than does the second community.

C.7 The system of embodiment C in which, in determining that the first community must reduce its power consumption, the server processor executes instructions to:
- determine that the first community has access to backup power.

C.8 The system of embodiment C in which, in determining that the first community must reduce its power consumption, the server processor executes instructions to:
- determine that the first community uses power less efficiently than does the second community.

C.1 The system of embodiment C further comprising a client terminal in communication with the server, the client terminal comprising:
- a client communications port:
- a display;
- a client memory; and
- a client processor,
- in which the client processor executes computer instructions stored in the client memory to:
  - decode a first encrypted message from the server;
  - determine, based on the decoded message, the first power level and the second power level;
  - cause the display to show a graphical rendition of the first power level and the second power level;
  - receive a user input;
  - generate a second encrypted message based on the user input; and
  - cause the client communications port to transmit the second encrypted message to the server.

C.1.1. The system of embodiment C.1 in which the user input is an instruction to reduce the power consumption of the first community.

C.1.2. The system of embodiment C.1 in which the client terminal is a smartphone.

C.2 The system of embodiment C in which each sensor is built into an appliance.

C.3 The system of embodiment C in which each sensor is a standalone device.

As will be appreciated, the foregoing represent but some contemplated embodiments, and these are not intended to be limiting in scope.

The invention claimed is:

1. A system comprising:
an electrical network comprising one or more power lines;
a set of two or more active appliances, each appliance connected to the electrical network and drawing electrical power from the electrical network;
a device connected to the electrical network, the device comprising:
a sensor for detecting a level of power in the electrical network;
a communications port;
a memory;
a processor, in which the processor executes computer instructions stored in the memory to:
receive from the sensor an indication of a first level of power in the electrical network;
determine that the first level of power exceeds a first permissible level of power;
determine a first appliance from the set of active appliances, in which determining the first appliance from the set of active appliances includes one or more of:
(a) determining the first appliance as the appliance that is using the most power from among the set of active appliances;
(b) determining the first appliance as the appliance that has a capability of continuing to operate from battery power;
(c) determining the first appliance as the appliance that has a capability of operating the longest from battery power of any of the set of active appliances; and
(d) determining the first appliance as the appliance that has the most battery power remaining of any of the set of active appliances; and
direct the communications port to transmit to the first appliance instructions to reduce its consumption of power from the electrical network.

2. The system of claim 1 further comprising a server, in which the processor further executes instructions to:
cause the communications port to transmit to the server the indication of the first power level.

3. The system of claim 1 further comprising a server, in which the processor further executes instructions to:
receive an indication that the first appliance has reduced its consumption of power; and
cause the communications port to transmit to the server the indication that the first appliance has reduced its consumption of power.

4. The system of claim 1 in which the device further comprises a back-up source of power.

5. The system of claim 1 in which the communications port is coupled to the electrical network and in which the communications port transmits the instructions to the first appliance via power line communication.

6. The system of claim 1 in which, in determining the first appliance, the processor determines the first appliance as the appliance that is using the most power from among the set of active appliances.

7. The system of claim 1 in which, in determining the first appliance, the processor determines the first appliance as the appliance that has a capability of continuing to operate from battery power.

8. The system of claim 1 in which, in determining the first appliance, the processor determines the first appliance as the appliance that has a capability of operating the longest from battery power of any of the set of active appliances.

9. The system of claim 1 in which, in determining the first appliance, the processor determines the first appliance as the appliance that has the most battery power remaining of any of the set of active appliances.

10. A system comprising:
an electrical network comprising one or more power lines;
a set of two or more active appliances, each appliance connected to the electrical network and drawing electrical power from the electrical network;
a device connected to the electrical network, the device comprising:
a sensor for detecting a level of power in the electrical network;
a communications port;
a memory;
a processor, in which the processor executes computer instructions stored in the memory to:
receive from the sensor an indication of a first level of power in the electrical network;
determine a time of day;
determine a first permissible level based on the time of day;
determine that the first level of power exceeds the first permissible level;
determine a first appliance from the set of active appliances; and
direct the communications port to transmit to the first appliance instructions to reduce its consumption of power from the electrical network.

11. A system comprising:
an electrical network comprising one or more power lines;
a set of two or more active appliances, each appliance connected to the electrical network and drawing electrical power from the electrical network;
a device connected to the electrical network, the device comprising:
a sensor for detecting a level of power in the electrical network;
a communications port;
a memory;
a processor, in which the processor executes computer instructions stored in the memory to:
receive from the sensor an indication of a first level of power in the electrical network;
determine that the first level of power exceeds a first permissible level of power;
direct the communications port to transmit to each of the active appliances a request for volunteering to reduce power consumption;
receive, via the communications port, indications from one or more of the active appliances of willingness to reduce power consumption; and
determine a first appliance from among the one or more of the active appliances that have indicated willingness to reduce power consumption; and direct the communications port to transmit to the first appliance instructions to reduce its consumption of power from the electrical network.

\* \* \* \* \*